United States Patent
Green et al.

(10) Patent No.: US 9,564,301 B2
(45) Date of Patent: Feb. 7, 2017

(54) SETTING ION DETECTOR GAIN USING ION AREA

(71) Applicant: Micromass UK Limited, Wilmslow (GB)

(72) Inventors: Martin Raymond Green, Bowdon (GB); Jason Lee Wildgoose, Stockport (GB); Steven Derek Pringle, Darwen (GB); Keith Richardson, Derbyshire (GB)

(73) Assignee: Micromass UK Limited, Wilmslow (GB)

(*) Notice: Subject to any disclaimer, the term of this patent is extended or adjusted under 35 U.S.C. 154(b) by 0 days.

(21) Appl. No.: 15/224,989

(22) Filed: Aug. 1, 2016

(65) Prior Publication Data
US 2016/0343556 A1   Nov. 24, 2016

Related U.S. Application Data

(63) Continuation of application No. 14/167,722, filed on Jan. 29, 2014, now Pat. No. 9,404,955.

(51) Int. Cl.
*H01J 49/00* (2006.01)
*G01R 29/26* (2006.01)

(52) U.S. Cl.
CPC .......... *H01J 49/0031* (2013.01); *G01R 29/26* (2013.01)

(58) Field of Classification Search
USPC ................. 250/397, 283, 281, 282
See application file for complete search history.

(56) References Cited

U.S. PATENT DOCUMENTS

| 7,047,144 | B2 | 5/2006 | Steiner | |
| 8,658,971 | B2 | 2/2014 | Green | |
| 8,935,101 | B2 | 1/2015 | Wright | |
| 2013/0268212 | A1* | 10/2013 | Makarov | H01J 49/025 |
| | | | | 702/32 |
| 2016/0035551 | A1* | 2/2016 | Green | H01J 49/0031 |
| | | | | 250/282 |
| 2016/0133448 | A1* | 5/2016 | Silivra | H01J 49/025 |
| | | | | 250/252.1 |

OTHER PUBLICATIONS

Cantero et al., "Determination of Non-Ionic Polyethoxylated Surfactants in Wastewater and River Water by Mixed Heinimicelle Extraction and Liquid Chromatography-Ion Trap Mass Spectrometry", Journal of Chromatography, vol. 1067, No. 1-2, pp. 161-170, 2005.
Wang et al., "Determination of Cediranib in Mouse Plasma and Brain Tissue Using High-Performance Liquid Chromatography Mass Spectrometry", Journal of Chromatography, vol. 879, No. 32, pp. 3812-3817, 2011.
Matysik et al., "Application of Gas Chromatography-Triple Quadrupole Mass Spectrometry to the Determination of Sterol Components in Biological Samples in Consideration of the Ionization Mode", Biochimie, vol. 95, pp. 489-495, 2013.

* cited by examiner

*Primary Examiner* — Kiet T Nguyen
(74) *Attorney, Agent, or Firm* — Diederiks & Whitelaw, PLC (57) ABSTRACT

A control system and method of determining a signal to noise (S/N) ratio of an ion detector system, including an ion detector, electron multiplier or photomultiplier, operates by determining an area of a noise peak, determining an area of a signal peak and determining a ratio of the area of the signal peak to the area of the noise peak. Based thereon, the signal to noise ratio can be optimized. The system has particular applicability for use in mass spectrometry.

14 Claims, 2 Drawing Sheets

Figure 1

Prior Art

Figure 2

SETTING ION DETECTOR GAIN USING ION AREA

CROSS REFERENCE TO RELATED APPLICATIONS

This application is a continuation application of U.S. application Ser. No. 14/167,722, filed 29 Jan. 2014. The entire contents of this application is incorporated herein by reference.

BACKGROUND TO THE PRESENT INVENTION

The present invention relates to a method of determining a signal to noise ratio, a method of operating an ion detector, a method of mass spectrometry, a control system for a mass spectrometer and a mass spectrometer.

Mass spectrometers incorporating an ion detector or electron multiplier are well known. It is desirable to arrange the gain of the ion detector such that signals arising from ion arrivals can be clearly differentiated from electronic noise. This is particularly important for orthogonal acceleration Time of Flight mass spectrometers in which many thousands of individual time of flight spectra may be summed to produce a final spectrum. In many cases the arrival rate of ions in each of these spectra may be relatively low and without efficient exclusion of electronic noise, signals arriving from individual ion arrivals at the ion detector may be far less intense than the accumulated or summed electronic noise.

It is advantageous that the signal to noise ratio is maintained at an optimum value such that signals from individual ion arrivals are sufficiently intense so as to be differentiated from electronic noise but not so intense that the dynamic range of the ion detection system is compromised.

It is known to use Time to Digital Converters ("TDC") and signal averagers or Analogue to Digital Converters ("ADC") to record the electronic signal produced by an ion detector in response to an ion arrival.

A Time to Digital Converter records an ion arrival event based upon an amplitude threshold. The amplitude threshold may comprise a fixed amplitude threshold or a constant fraction discriminator. The amplitude threshold is set to exclude a high percentage of the electronic noise. The gain of the ion detector is then adjusted to ensure that a significant portion of the signals arising from ion arrivals have a height which exceeds this threshold. This ensures that the majority of ion arrivals result in a recorded event.

A signal averager digitises the signal arising from an ion arrival using an Analogue to Digital Converter. Again it is important to exclude a high percentage of the digitised electronic noise from each time of flight spectrum before summing multiple spectra. Conventionally, an amplitude threshold is used to exclude electronic noise. The threshold may be set to exclude recorded signal below a preset number of least significant bits ("LSBs") corresponding to the height of the digitised signal.

The gain of the ion detector may then be adjusted to ensure that a significant portion of the digitised signals arising from ion arrivals have a height which exceeds this threshold. This ensures that the majority of ion arrivals result in a recorded event.

The noise may be excluded from the final data by applying a fixed predetermined height threshold or a dynamic or adaptive height amplitude threshold such as is disclosed in U.S. Pat. No. 8,598,513 (Micromass), the contents of which are incorporated herein by reference.

Single ions striking an ion detector give rise to a range of different signal intensities due to the ion detector having an inherent pulse height distribution. This variation in intensity is due to the statistical nature of secondary electron emission associated with an electron multiplier. The average height is related to the mass to charge ratio value and the charge state of the ion as electron yield is related to the velocity and the energy of the ions striking the ion detector. The ion detector gain is usually set for a specific analyte species such that a large proportion (>85%) of all the signals from single ion strikes can be differentiated from electronic noise.

The advantages of peak detecting ADCs are well known and reference is made to US 2009/0321628 (Micromass). In particular, differentiation between signal and noise can be made on the basis of the ion area, for example, in the manner as described in US 2012/0126110 (Micromass), the contents of which are incorporated herein by reference. This method provides superior differentiation between signal and noise thereby allowing lower detector gain and hence a lower digitised signal height can be employed which improves detector lifetime and, importantly, increases the usable dynamic range of the ADC.

It is desired to provide an improved method of operating an ion detector, an improved mass spectrometer and an improved method of mass spectrometry.

SUMMARY OF THE PRESENT INVENTION

According to an aspect of the present invention there is provided method of determining a signal to noise (S/N) ratio of an ion detector system comprising an ion detector, electron multiplier or photomultiplier comprising:

determining the area of a noise peak;
determining the area of a signal peak; and
determining the ratio of the area of said signal peak to the area of said noise peak.

The preferred embodiment relates to methods of setting an ion detector system signal to noise for optimum operation and importantly additionally relates to various methods of adjusting the ion detector gain in order to maintain optimum performance throughout the ion detector lifetime.

According to a preferred embodiment an optimum signal to noise ratio is preferably set and is preferably maintained based upon the average ion area rather than the average ion height. Setting the ion detector using average ion area according to the preferred embodiment (compared with other conventional methods which utilise average ion height) is particularly advantageous in terms of maximising the dynamic range of an ADC and also maximising the lifetime of an ion detector by minimising the operational gain.

The area of an ion peak is directly correlated to the gain of an ion detector and is independent of the temporal width of a signal produced by the ion detector due to an ion arrival. However, the height of an ion peak depends upon the gain of the ion detector and the temporal width of single ion arrivals.

The method of setting the signal to noise based upon ion area according to the preferred embodiment is particularly robust to changes in the temporal width of ion arrivals generated by different types of detectors. For example, a single ion arrival signal 50 LSB high and 2 digitisation samples wide at half height FWHM has an area of 100 and a height of 50 LSBs. The area of the ion peak is correlated directly to the gain of the electron multiplier i.e. the number of electrons produced for a single ion strike. At the same overall gain a slower detection system may give a FWHM of 4 digitisation samples and a height of 25 LSB. In this instance, the height has changed and any thresholding or calculation of signal to noise based on height will need to be adjusted. However, as the area measurement is directly correlated to gain, no recalculation of the signal to noise needs to be performed.

According to an embodiment of the present invention the signal to noise for optimal performance is preferably set using the peak detected area of the ion arrival event and the peak detected area of the noise rather than the height of the ion arrival event and the height of the noise.

The method according to the preferred embodiment represents an improvement over conventional methods in which the height of the signal is set relative to the height of the noise.

The procedure for determining the gain required for optimum signal to noise is generally relatively time consuming. As the ion detector gain for a given detector voltage decreases with use it may be impractical to regularly repeat this procedure throughout the lifetime of the ion detector.

In addition to determining the ion detector gain required for optimum signal to noise it may also be desirable to determine the ion detector gain required to achieve a predetermined precision of area measurement and/or arrival time measurement. The precision of the area and arrival time measurement of digitised signals from ion arrivals at the ion detector is affected by the number of digitization samples across the signal and the number of ADC LSB's for each sample. In instances where the pulse height distribution is narrow, the signal to noise required to record the majority of ion arrivals can be achieved with relatively low digitised intensity. The precision of the area and/or arrival time for a signal represented by few ADC LSBs will be low. Low precision in measurement for individual signals affects the precision of the area and time of flight recorded for the peaks in the final summed or histogrammed spectrum. In this situation the detector gain may be increased to increase the precision of the individual measurements.

Low precision in area and time measurement for individual signals affects the precision of the area and position recorded for the peaks in the final summed or histogrammed spectrum.

Once the gain required for optimum signal to noise has been determined the average ion area under these conditions can be recorded.

This value can then be used as a reference value to monitor and or adjust the detector gain or supply voltage periodically throughout the detector life time. This ensures that the signal to noise and hence optimum performance of the system is preferably maintained without directly re-measuring the conditions for best signal to noise. The average ion area value may be measured much more quickly than the process required to determine the detector voltage for optimum signal to noise and so can be repeated frequently without excessive time penalty.

According to another aspect of the present invention the average ion area or value correlated to the average ion area is periodically measured and the ion detector gain or detector supply voltage is adjusted to maintain the average ion area at a value determined to provide optimum signal area to noise area characteristics.

The combination of using the area of the digitised signal rather than the height to both determine detector gain for optimum signal to noise and to monitor and adjust for gain changes throughout the detector lifetime represents a significant advantage over conventional methods.

According to an aspect of the present invention there is provided a method of mass spectrometry comprising:
providing an ion source, a mass analyser and an ion detector or electron multiplier;
digitising the signal arising from ion arrivals at the ion detector or electron multiplier;
processing the digitised data to produce time and area measurements for the digitised signal;
adjusting the gain of an ion detector or electron multiplier such that a desired signal area to noise area ratio is achieved for the processed data arising from the arrival of an ion at the detector;
measuring a first value corresponding to or correlated to the average area of the digitised signal arising from the arrival of an ion at the detector or electron multiplier;
during subsequent operation, periodically re-measuring the first value corresponding to or correlated to the average area of the digitised signal arising from the arrival of an ion at the detector or electron multiplier to produce a second value; and
adjusting the gain or voltage supply of the ion detector or electron multiplier such that the second measured value is adjusted to be substantially the same as the first measured value.

According to a preferred embodiment the gain of an ion detector may be adjusted such that the measurement of ion intensity or ion area has a desired precision in addition to a desired signal noise ratio for the processed data arising from the arrival of an ion at the detector.

The noise peak is preferably obtained from a signal output from the ion detector, electron multiplier or photomultiplier when no ions, electrons or photons are impinging upon the ion detector, electron multiplier or photomultiplier.

The signal peak is preferably obtained from a signal output from the ion detector, electron multiplier or photomultiplier when ions, electrons or photons are impinging upon the ion detector, electron multiplier or photomultiplier.

The method preferably further comprises prior to determining the ratio of the area of the signal peak to the area of the noise peak the steps of:
(i) filtering a first signal output from an Analogue to Digital Converter by applying a threshold amplitude to the first signal so as to reject or attenuate peaks having an amplitude less than a threshold thereby generating a second signal;
(ii) peak detecting the second signal to generate first data comprising one or more peak area values and one or more time values;
(iii) filtering the first data by applying a threshold area to the first data so as to reject or attenuate peaks having a peak area value less than a threshold thereby generating second data; and
(iv) combining or histogramming the second data with other corresponding data.

According to another aspect of the present invention there is provided a method of operating an ion detector system comprising an ion detector, electron multiplier or photomultiplier comprising:
determining a signal to noise (S/N) ratio of the ion detector, electron multiplier or photomultiplier according to a method as claimed in any preceding claim; and then
optimising the signal to noise ratio.

The step of optimising the signal to noise ratio preferably comprises altering, adjusting or setting a gain of the ion detector, electron multiplier or photomultiplier.

The step of altering, adjusting or setting a gain of the ion detector, electron multiplier or photomultiplier preferably comprises altering, adjusting or setting a supply voltage to the ion detector, electron multiplier or photomultiplier.

The step of altering, adjusting or setting a gain of the ion detector, electron multiplier or photomultiplier preferably comprises altering, adjusting or setting a gain of the ion detector, electron multiplier or photomultiplier so that at least x % of single ion arrivals are recorded, wherein x≤100.

According to an embodiment x is selected from a group consisting: (i) <10; (ii) 10-20; (iii) 20-30; (iv) 30-40; (v) 40-50; (vi) 50-60; (vii) 60-70; (viii) 70-80; (ix) 80-90; (x) 90-100.

According to a preferred embodiment x≥80, 81, 82, 83, 84, 85, 86, 87, 88, 89 or 90.

The method preferably further comprises determining a first average ion area or a first value correlated to an average ion area at a first time T1.

The method preferably further comprises using the first average ion area or a first value correlated to an average ion area as a reference.

The method preferably further comprises checking or re-checking the gain of the ion detector, electron multiplier or photomultiplier, preferably periodically.

The step of checking or re-checking the gain of the ion detector, electron multiplier or photomultiplier preferably comprises:

(i) determining a second average ion area or a second value correlated to an average ion area at a later second time T2;

(ii) comparing the second average ion area or the second value correlated to an average ion area with the first average ion area or the first value correlated to an average ion area and determining whether or not the second average ion area or the second value correlated to an average ion area is within a first range;

wherein if it is determined that the second average ion area or the second value correlated to an average ion area falls outside of the first range then the method further comprises altering, adjusting or optimising a gain of the ion detector, electron multiplier or photomultiplier; and wherein if it is determined that the second average ion area or the second value correlated to an average ion area falls inside the first range then the method further comprises acquiring further data.

The method preferably further comprises checking or re-checking the signal to noise ratio of the ion detector, electron multiplier or photomultiplier, preferably periodically.

The step of checking or re-checking the signal to noise ratio of the ion detector, electron multiplier or photomultiplier preferably comprises altering, adjusting or setting a gain of the ion detector, electron multiplier or photomultiplier.

According to another aspect of the present invention there is provided a method of mass spectrometry comprising a method as described above.

According to another aspect of the present invention there is provided a control system arranged and adapted to determine a signal to noise (S/N) ratio of an ion detector system comprising an ion detector, electron multiplier or photomultiplier, wherein the control system is arranged and adapted:

(i) to determine the area of a noise peak;
(ii) to determine the area of a signal peak; and
(iii) to determine the ratio of the area of the signal peak to the area of the noise peak.

According to another aspect of the present invention there is provided a control system for operating an ion detector system comprising an ion detector, electron multiplier or photomultiplier, wherein the control system is arranged and adapted:

(i) to determine a signal to noise (S/N) ratio of the ion detector, electron multiplier or photomultiplier by determining the area of a noise peak, determining the area of a signal peak and determining the ratio of the area of the signal peak to the area of the noise peak; and (ii) to optimise the signal to noise ratio.

The control system is preferably arranged and adapted:

(i) to determine a first average ion area or a first value correlated to an average ion area at a first time T1 and to use the first average ion area or the first value correlated to an average ion area as a reference;

(ii) to check or re-check the gain of the ion detector, electron multiplier or photomultiplier, preferably periodically;

(iii) to determine a second average ion area or a second value correlated to an average ion area at a later second time T2;

(iv) to compare the second average ion area or the second value correlated to an average ion area with the first average ion area or the first value correlated to an average ion area and to determine whether or not the second average ion area or the second value correlated to an average ion area is within a first range;

wherein if it is determined that the second average ion area or the second value correlated to an average ion area falls outside of the first range then the control system is arranged and adapted to alter, adjust or optimise a gain of the ion detector, electron multiplier or photomultiplier; and wherein if it is determined that the second average ion area or the second value correlated to an average ion area falls inside the first range then the control system is arranged and adapted to acquire further data.

According to another aspect of the present invention there is provided a mass spectrometer or analytical instrument comprising a control system as described above.

The mass spectrometer or analytical instrument preferably further comprises an ion detector, electron multiplier or photomultiplier.

According to an embodiment the mass spectrometer may further comprise:

(a) an ion source selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; (xx) a Glow Discharge ("GD") ion source; (xxi) an Impactor ion source; (xxii) a Direct Analysis in Real Time ("DART") ion source; (xxiii) a Laserspray Ionisation ("LSI") ion source; (xxiv) a Sonicspray Ionisation ("SSI") ion source; (xxv) a Matrix Assisted Inlet Ionisation ("MAII") ion source; and (xxvi) a Solvent Assisted Inlet Ionisation ("SAII") ion source; and/or (b) one or more continuous or pulsed ion sources; and/or (c) one or more ion guides; and/or (d) one or more ion mobility separation devices and/or one or more Field Asymmetric Ion Mobility Spectrometer devices; and/or (e) one or more ion traps or one or more ion trapping regions; and/or (f) one or more collision, fragmentation or reaction cells selected from the group consisting of: (i) a Collisional Induced Dissociation ("CID") fragmentation device; (ii) a Surface Induced Dissociation ("SID") fragmentation device; (iii) an Electron Transfer Dissociation ("ETD") fragmentation device; (iv) an Electron Capture Dissociation ("ECD") fragmentation device; (v) an Electron Collision or Impact Dissociation fragmentation device; (vi) a Photo Induced Dissociation ("PID") fragmentation device; (vii) a Laser Induced Dissociation fragmentation device; (viii) an infrared radiation induced dissociation device; (ix) an ultraviolet radiation induced dissociation device; (x) a nozzle-skimmer interface fragmentation device; (xi) an in-source fragmentation device; (xii) an in-source Collision Induced Dissociation fragmentation device; (xiii) a thermal or temperature source fragmentation device; (xiv) an electric field induced fragmentation device; (xv) a magnetic field induced fragmentation device; (xvi) an enzyme digestion or enzyme degradation fragmentation device; (xvii) an ion-ion reaction fragmentation device; (xviii) an ion-molecule reaction fragmentation device; (xix) an ion-atom reaction fragmentation device; (xx) an ion-metastable ion reaction fragmentation device; (xxi) an ion-metastable molecule reaction fragmentation device; (xxii) an ion-metastable atom reaction fragmentation device; (xxiii) an ion-ion reaction device for reacting ions to form adduct or product ions; (xxiv) an ion-molecule reaction device for reacting ions to form adduct or product ions; (xxv) an ion-atom reaction device for reacting ions to form adduct or product ions; (xxvi) an ion-metastable ion reaction device for reacting ions to form adduct or product ions; (xxvii) an ion-metastable molecule reaction device for reacting ions to form adduct or product ions; (xxviii) an ion-metastable atom reaction device for reacting ions to form adduct or product ions; and (xxix) an Electron Ionisation Dissociation ("EID") fragmentation device; and/or (g) a mass analyser selected from the group consisting of: (i) a quadrupole mass analyser; (ii) a 2D or linear quadrupole mass analyser; (iii) a Paul or 3D quadrupole mass analyser; (iv) a Penning trap mass analyser; (v) an ion trap mass analyser; (vi) a magnetic sector mass analyser; (vii) Ion Cyclotron Resonance ("ICR") mass analyser; (viii) a Fourier Transform Ion Cyclotron Resonance ("FTICR") mass analyser; (ix) an electrostatic mass analyser arranged to generate an electrostatic field having a quadro-logarithmic potential distribution; (x) a Fourier Transform electrostatic mass analyser; (xi) a Fourier Transform mass analyser; (xii) a Time of Flight mass analyser; (xiii) an orthogonal acceleration Time of Flight mass analyser; and (xiv) a linear acceleration Time of Flight mass analyser; and/or (h) one or more energy analysers or electrostatic energy analysers; and/or (i) one or more ion detectors; and/or (j) one or more mass filters selected from the group consisting of: (i) a quadrupole mass filter; (ii) a 2D or linear quadrupole ion trap; (iii) a Paul or 3D quadrupole ion trap; (iv) a Penning ion trap; (v) an ion trap; (vi) a magnetic sector mass filter; (vii) a Time of Flight mass filter; and (viii) a Wien filter; and/or (k) a device or ion gate for pulsing ions; and/or (l) a device for converting a substantially continuous ion beam into a pulsed ion beam.

The mass spectrometer may further comprise either:

(i) a C-trap and a mass analyser comprising an outer barrel-like electrode and a coaxial inner spindle-like electrode that form an electrostatic field with a quadro-logarithmic potential distribution, wherein in a first mode of operation ions are transmitted to the C-trap and are then injected into the mass analyser and wherein in a second mode of operation ions are transmitted to the C-trap and then to a collision cell or Electron Transfer Dissociation device wherein at least some ions are fragmented into fragment ions, and wherein the fragment ions are then transmitted to the C-trap before being injected into the mass analyser; and/or (ii) a stacked ring ion guide comprising a plurality of electrodes each having an aperture through which ions are transmitted in use and wherein the spacing of the electrodes increases along the length of the ion path, and wherein the apertures in the electrodes in an upstream section of the ion guide have a first diameter and wherein the apertures in the electrodes in a downstream section of the ion guide have a second diameter which is smaller than the first diameter, and wherein opposite phases of an AC or RF voltage are applied, in use, to successive electrodes.

According to an embodiment the mass spectrometer further comprises a device arranged and adapted to supply an AC or RF voltage to the electrodes. The AC or RF voltage preferably has an amplitude selected from the group consisting of: (i) <50 V peak to peak; (ii) 50-100 V peak to peak; (iii) 100-150 V peak to peak; (iv) 150-200 V peak to peak; (v) 200-250 V peak to peak; (vi) 250-300 V peak to peak; (vii) 300-350 V peak to peak; (viii) 350-400 V peak to peak; (ix) 400-450 V peak to peak; (x) 450-500 V peak to peak; and (xi) >500 V peak to peak.

The AC or RF voltage preferably has a frequency selected from the group consisting of: (i) <100 kHz; (ii) 100-200 kHz; (iii) 200-300 kHz; (iv) 300-400 kHz; (v) 400-500 kHz; (vi) 0.5-1.0 MHz; (vii) 1.0-1.5 MHz; (viii) 1.5-2.0 MHz; (ix) 2.0-2.5 MHz; (x) 2.5-3.0 MHz; (xi) 3.0-3.5 MHz; (xii) 3.5-4.0 MHz; (xiii) 4.0-4.5 MHz; (xiv) 4.5-5.0 MHz; (xv) 5.0-5.5 MHz; (xvi) 5.5-6.0 MHz; (xvii) 6.0-6.5 MHz; (xviii) 6.5-7.0 MHz; (xix) 7.0-7.5 MHz; (xx) 7.5-8.0 MHz; (xxi) 8.0-8.5 MHz; (xxii) 8.5-9.0 MHz; (xxiii) 9.0-9.5 MHz; (xxiv) 9.5-10.0 MHz; and (xxv) >10.0 MHz.

The mass spectrometer may also comprise a chromatography or other separation device upstream of an ion source. According to an embodiment the chromatography separation device comprises a liquid chromatography or gas chromatography device. According to another embodiment the separation device may comprise: (i) a Capillary Electrophoresis ("CE") separation device; (ii) a Capillary Electrochromatography ("CEC") separation device; (iii) a substantially rigid ceramic-based multilayer microfluidic substrate ("ceramic tile") separation device; or (iv) a supercritical fluid chromatography separation device.

The ion guide is preferably maintained at a pressure selected from the group consisting of: (i) <0.0001 mbar; (ii) 0.0001-0.001 mbar; (iii) 0.001-0.01 mbar; (iv) 0.01-0.1 mbar; (v) 0.1-1 mbar; (vi) 1-10 mbar; (vii) 10-100 mbar; (viii) 100-1000 mbar; and (ix) >1000 mbar.

BRIEF DESCRIPTION OF THE DRAWINGS

Various embodiments of the present invention together with other arrangements given for illustrative purposes only will now be described, by way of example only, and with reference to the accompanying drawings in which.

DETAILED DESCRIPTION OF PREFERRED EMBODIMENT

Figure 1:
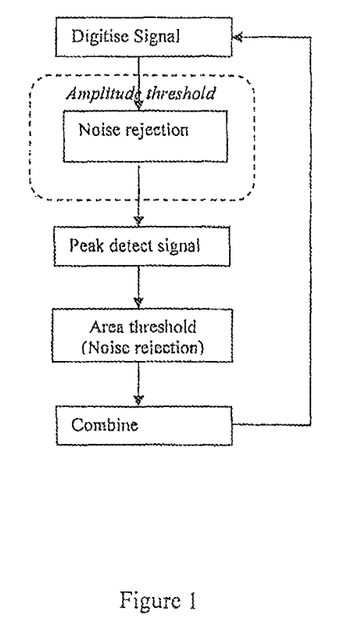
FIG. 1 shows a conventional electronic noise rejection method which is utilised according to a preferred embodiment of the present invention.

FIG. 1 shows a known method of electronic noise rejection as described in US 2012/0126110 (Micromass) the contents of which are incorporated herein by reference. This process is followed as a first step in the determination of a reference signal to noise ratio according to a preferred embodiment of the present invention.

With reference to FIG. 1, the output from an ADC is subjected to a relatively low amplitude threshold in order to reject at least some background noise. Ion peaks and some noise spikes are not filtered out by the relatively low amplitude noise threshold applied to the output of the ADC.

The ion peaks and noise spikes which are not filtered out by the low amplitude threshold are then subjected to peak detection which results in data being produced in the form of time and peak area values.

The data is then subjected to an area threshold filtering step wherein peaks having a peak area below a preferred or predetermined peak area threshold are preferably rejected, attenuated or otherwise filtered out as these are preferably considered to relate to noise spikes rather than ion peaks.

The time and intensity data which remains after the area thresholding step has been performed is then preferably combined or integrated with other time and intensity data in order to produce a composite mass spectrum or other composite data.

According to the preferred embodiment the area thresholding step is preferably performed prior to combining mass spectral data i.e. peak area thresholding is preferably performed on a push-by-push basis wherein the data is preferably subjected to threshold filtering immediately after a first pulse of ions has been accelerated into a time of flight region of a mass spectrometer and prior to a second pulse of ions being accelerated into the time of flight region. This step significantly reduces the amount of data which needs to be processed by the control system preferably in real time.

Figure 2:
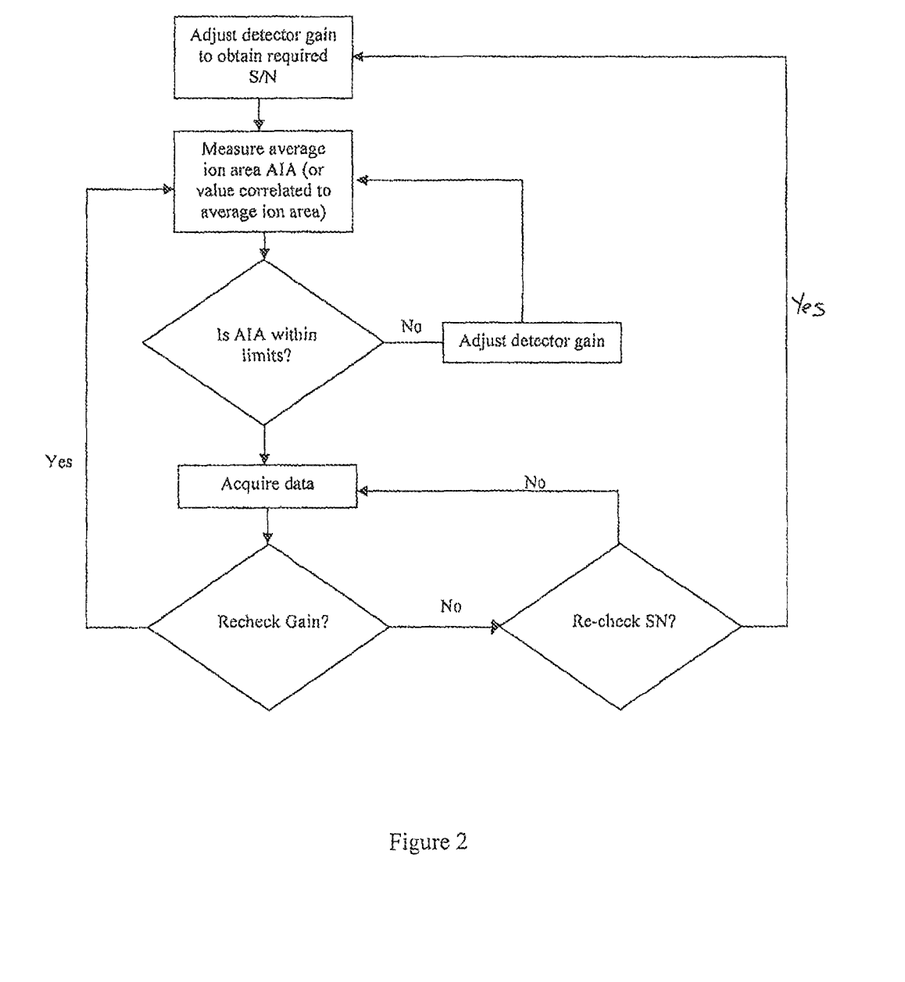
FIG. 2 shows a flow diagram illustrating a preferred embodiment of the present invention wherein a control system determines whether or not an average ion area falls within desired limits and adjusts the ion detector gain if the average ion area is determined to fall outside of desired limits.

FIG. 2 shows a flow diagram illustrating a preferred embodiment of the present invention.

One aspect of the preferred embodiment is that the ion detector gain is preferably initially adjusted to set the ion detector to operate at an optimum signal area to noise area ratio.

The process of setting the ion detector to operate at the optimum signal to noise ratio preferably comprises initially setting a noise exclusion threshold as described above in relation to FIG. 1 and then adjusting the ion detector gain by altering the supply voltage to obtain the optimum signal to noise. This process results in differentiation of signal from electronic noise on the basis of the area of the peak detected signal which provides an advantage over conventional methods which measure only the height of the digitised signal.

Once the optimum signal to noise ratio has been determined and the ion detector gain has been adjusted in order to operate at an optimum signal to noise ratio, the average ion area ("AIA") is then preferably measured under these optimum operating conditions. The initial measurement of the average ion area may be stored in memory as a record of the average ion area which is preferably required in order to obtain an optimum signal to noise ratio. The average ion area which is determined may therefore be treated as a reference level and subsequent measurements of the average ion area may then be compared with the reference average ion area after the ion detector has been used for a period of time.

The average ion area may be used to estimate the number of ion arrival events in each mass spectral peak after combination of many time of flight spectra. The total area of a mass spectral peak in a combined or composite spectrum divided by the average ion area will give an estimate of the number of ion arrivals in that mass spectral peak regardless of the ion arrival rate or any variation in the ion arrival rate over the integration time.

The estimated ion count may then be used to estimate the precision of the area of the final mass spectral peak and/or the precision of the arrival time or mass measurement of the final mass spectral peak. These uncertainty measurements may then be used to guide post processing steps.

Estimating the number of ion counts based on the average ion area and the average area of the final combined data yields a more reliable estimate of the number of ion arrivals than comparing the average ion height to the final height of the spectral peak in the combined data due to the fact that identical ions will not all arrive at the ion detector at exactly the same flight time. Instead, as will be understood by those skilled in the art, the ion arrival time of a particular species of ions will fall within an ion arrival time envelope dictated by the underlying system geometry.

Multiple ions arriving at slightly different times will overlap, but since the ions are not exactly coincident then they will yield a combined or summed signal having a lower absolute height than would be the case if all the ions arrived at exactly the same time.

Dividing the height of the final spectral peak by the average ion height would give an estimated number of ion arrivals which would be lower than the true number of ion arrivals. One advantage of the preferred embodiment is that by using a peak detecting ADC method as described above and recording the average ion area enables a more accurate measurement of the number of ion arrivals to be made.

It should be noted that it is sufficient to calculate a value which is simply correlated to the average ion area rather necessarily having to determine the exact value of the average ion area. For example, according to an embodiment the mean of the average ion area for several different ion species may be used. According to yet further embodiments any other value relevant to the pulse height distribution of the ion area other than the mean may be utilised as long as the same method is utilised for subsequent checks of the average ion area.

In situations where some electronic noise remains in the final data it can be advantageous to measure the mean of the ion area above a predetermined higher amplitude threshold.

Such an approach ensures that the electronic noise does not skew the measurement of the mean ion area at very low ion arrival rates.

Having preferably determined the average ion area (or a value correlated to the average ion area) the average ion area which is determined is preferably compared to an average ion area which is preferably stored as a reference value in the previous step. If the determined average ion area is determined to be within a predetermined error value from the stored or reference average ion area then the system preferably proceeds to acquire analytical data.

After analytical data has been acquired a decision may be made whether or not to check or re-check the average ion area. The average ion area may be checked or re-checked after each acquisition or after a pre-determined number of acquisitions. According to another embodiment the average ion area may be checked or re-checked after a pre-determined time interval from the last check or re-check of the average ion area.

If a decision is made to check or re-check the average ion area, then the average ion area is preferably measured again by substantially the same method as used to obtain the initial reference value. If it is different within a set limit from the value of the average ion area which is preferably stored in memory then the ion detector gain may preferably be adjusted deterministically or iteratively until the average ion area as measured is determined to be within an acceptable error.

According to an embodiment of the present invention after a relatively longer time interval it may be advantageous to periodically check or re-check the optimum signal to noise value. The optimum signal to noise conditions may be determined again and the average ion area under the new optimum operational conditions may then be determined. The new average ion area which is determined may preferably replace the previous benchmark average ion area value which is preferably stored in memory. The step of determining afresh the optimum signal to noise ratio is particularly advantageous if the pulse height distribution of ions arriving at the ion detector changes slightly over a period of time as, for example, either the ion detector ages and/or if the noise increases.

Several different methods of determining the level of background or electronic noise and hence the area threshold required are contemplated. In all cases data is preferably acquired in a mode of operation without any ions striking the ion detector so that any signal from the ion detector preferably comprises substantially only electronic noise. For example, according to an embodiment the noise level may be determined by calculating the mean and standard deviation of the digitised electronic noise by repetitively acquiring single time of flight spectra in peak detecting mode. This information may be used to calculate a suitable area threshold or a combination of amplitude and area thresholds.

Alternatively, an amplitude and/or peak area threshold may be determined empirically by observing the minimum value at which the threshold excludes substantially all or the majority of the electronic noise.

Once the noise level is known or has otherwise been determined the ion detector is then preferably adjusted to achieve the desired signal to noise. Several methods for determining the optimum signal to noise are contemplated.

Method #1

According to a first preferred method a threshold may be applied in a first step in order to substantially exclude electronic noise from the data.

During the course of a second subsequent step data may be acquired in a mode wherein the signal is digitised and processed to produce time and intensity pairs wherein the intensity value is preferably set to a constant value regardless of the actual calculated area prior to accumulating into a composite spectrum. This mode of operation is analogous to a peak detecting Time to Digital Converter ("TDC") mode of operation wherein an ion arrival event results in a constant intensity output. The intensity value representing an ion arrival event is preferably set to 1.

During the course of a third subsequent step the gain of the ion detector is preferably adjusted while monitoring a mass spectral peak area in a combined data set until it is determined that a predetermined number (e.g. >85%) of single ion arrivals are recorded.

In order to set the gain of the ion detector such that e.g. >85% of single ion arrivals will be recorded, it will be understood that at the point where the area of 100% or all ion arrivals exceeds the threshold, the number of events recorded for a peak per unit time will not increase if the gain of the detector is further increased. Substantially 100% of all the signals produced as a result of ions striking the detector will be recorded.

The gain of the ion detector is preferably reduced slightly such that the number of events recorded per unit time is a predetermined percentage of this maximum value e.g. according to an embodiment 85% of single ion arrival events may be arranged to be recorded.

This process preferably ensures that the vast majority of single ion arrivals are recorded at the minimum possible detector gain and average ion area value thereby improving the lifetime of the ion detector and importantly maximising the dynamic range provided by the vertical digitisation resolution of the ADC.

Method #2

According to a second method the areas of each single ion arrival from single peak detected time of flight spectra are measured and are preferably used to create a histogram of ion areas detected according to a first step.

During the course of a second subsequent step the gain of the ion detector may be adjusted to obtain a desired mean value of ion area if the pulse height distribution (PHD) of the ion detector is known or until the pulse height distribution obtained is such that >85% of single ions will be differentiated from noise.

Method #3

According to a third method combined spectral data may be acquired including at least one singly charged species and at least one multiply charged species having similar mass to charge ratios. The ratio of the area of the two peaks at different detector gain settings may be used to determine the detector gain setting at which the ratio of the peaks does not vary with increasing gain. This point will indicate that all ion arrivals are detected in both of the different charge state species.

As the mean of the pulse height distribution for a low charge state is less than for a high charge state species at similar mass to charge ratios, this method will determine the signal to noise ratio required in order to efficiently detect the lower charge state. The ion arrival rate is preferably set such that predominantly single ions arrive for each species within each time of flight spectrum.

A similar method may be utilised using isotope, adduct, product, fragment or other ratios of ion species having the same charge state if one species has a larger proportion of multiple ion arrivals than the other or has a significantly different mass to charge ratio value. This again relies on the difference between the pulse height distributions for these species.

These methods may be performed in either peak detecting ADC or TDC modes.

Method #4

According to a fourth method the number of detected ion event for a species may be recorded during a first step as a proportion of the number of individual time of flight spectra combined.

During a second step assuming a Poisson distribution of ion arrivals, the number of events as a ratio of the total number of time of flight spectra gives a measure of λ or the average ion arrival rate. The point where this value remains constant as the ion detector voltage is increased indicates that all ions are detected for this species indicating an acceptable signal to noise ratio. It is contemplated that this value may be calculated during histogramming within the memory of the ADC.

Once the signal to noise ratio is determined the average ion area or a value correlated to the average ion area for single ion arrivals may be measured and used for subsequent ion detector gain correction.

Ion Detector Gain Correction

Several methods of ion detector gain correction may be utilised according to various embodiments of the present invention.

According to a first preferred method the ratio of the area of a mass spectral peak in a combined spectra in peak detecting TDC mode to the area of the mass spectral peak in the combined spectra in standard peak detecting ADC mode may be measured for a substantially identical number of combined time of flight spectra under the conditions for optimum signal to noise.

These measurement should preferably be made as close as possible in time in order to minimise errors due to ion arrival rate fluctuation and should preferably cover sufficient ion arrival events in the species used so as to ensure suitable statistical precision. For example, time of flight spectra may be acquired by alternating between combining for a short time period in peak detecting ADC mode and combining for the same time period in peak detecting TDC mode.

In order to improve statistical precision many spectra from each mode may be subsequently combined. This ensures that slow or random fluctuations in ion arrival rate, for example, due to ion source instability do not corrupt the ratio.

In a less preferred embodiment it is contemplated that the ADC may alternate between peak detecting ADC and peak detecting TDC on the time scale of each individual time of flight spectra. Two combined spectra may be produced within the ADC memory—one containing all data from peak detecting ADC mode and the other all data from peak detecting TDC mode. When sufficient data has been acquired to ensure good statistical precision the ratio of the area of the same mass spectral peak in the combined data will give a measure of the average ion area.

Using a similar method to estimate the average ion height will yield inaccurate results as summed signals from overlapping in arrivals which are not exactly coincident in time will not increase in height in direct proportion to the number of arrivals. However, the area will increase in direct proportion to the number of ion arrivals.

According to a second preferred method the ion area may be estimated from statistical intensity variations of acquired data.

The second preferred method preferably comprises the steps of: (i) acquiring a combined spectrum over a predetermined mass range from a chosen sample; (ii) calculating the variance of the noise of the square root of the signal; and (iii) assuming a Poisson arrival distribution then calculating the variance for this data set which will be directly correlated to the mean of the ion area distribution.

This method gives a value which is correlated to the actual average ion area of a single species as it estimates the ion area averaged over all species over the mass range acquired. This method has the advantage of allowing a very rapid statistically precise value correlated with the average ion area since ions from many species including chemical background over a wide mass or mass to charge ratio range are utilised in the measurement. This method is also robust in the presence of signals within the spectrum which contain multiple ion arrivals in individual time of flight spectra. It is therefore unnecessary to adjust the ion arrival rate to ensure single ion arrival conditions prior to making the measurement.

Several methods may be used to calculate the variance of the noise.

Using a similar method to estimate the average ion height will yield inaccurate results as summed signals from overlapping in arrivals which are not exactly coincident in time will not increase in height in direct proportion to the number of arrivals. However, the area will increase in direct proportion to the number of ion arrivals.

Although the preferred embodiment is described with reference to a Time of Flight mass spectrometer, the methods described above may alternatively be applied to other instruments which, for example, employ an electron multiplier or a photomultiplier in which the optimum detector gain needs to be determined and preferably periodically adjusted.

During calculation of the average ion area other information may be calculated and stored. For example, higher order moments such as skew and/or kurtosis and/or peak width may be calculated or otherwise determined. These values may also be used to determine if a signal is noise or arises from an ion arrival at the ion detector.

According to an embodiment signals arising from multiple ion arrivals may be differentiated by interrogating the peak shape and/or peak width. These may then be excluded from the calculations of average ion area if it is deemed that they would corrupt the measurement or estimation of average ion area. This cannot be achieved by recording ion height alone.

Although the present invention has been described with reference to preferred embodiments, it will be understood by those skilled in the art that various changes in form and detail may be made without departing from the scope of the invention as set forth in the accompanying claims.

The invention claimed is:

1. A method of operating an ion detector system comprising an ion detector, electron multiplier or photomultiplier, the method comprising:
   (i) determining a gain of the ion detector, electron multiplier or photomultiplier such that a desired signal to noise ratio (S/N) is achieved for the ion detector, electron multiplier or photomultiplier;
   (ii) determining an average ion area, or a value correlated to an average ion area when said ion detector, electron multiplier or photomultiplier is set at the gain determined in (i), and recording this average ion area, or value correlated to an average ion area as a reference value; and (iii) periodically or repeatedly altering, adjusting or setting the gain of the ion detector, electron multiplier or photomultiplier so as to maintain the average ion area, or value correlated to an average ion area at said reference value.

2. A method as claimed in claim 1, wherein the average ion area, or value correlated to an average ion area is calculated using an area or an integrated intensity of mass spectral peaks in signals arising from ion arrivals at the ion detector, electron multiplier or photomultiplier.

3. A method as claimed in claim 1, wherein step (iii) comprises comparing a subsequent value of average ion area, or value correlated to an average ion area with said reference value;

wherein if it is determined that said subsequent value of average ion area, or value correlated to an average ion area is within a predetermined error value from said reference value then proceeding to acquire further data; and wherein if it is determined that said subsequent value of average ion area, or value correlated to an average ion area is outside a predetermined error value from said reference value then proceeding to adjust the gain of the ion detector, electron multiplier or photomultiplier until the average ion area, or value correlated to an average ion area is within said predetermined error value from said reference value.

4. A method as claimed in claim 1, wherein steps (i) and (ii) are performed under the same operating conditions of the ion detector system.

5. A method as claimed in claim 1, wherein said desired signal to noise (S/N) ratio is determined by altering, adjusting or setting a gain of said ion detector, electron multiplier or photomultiplier so that at least x % of single ion arrivals are recorded, wherein x≤100.

6. A method as claimed in claim 5, wherein x is selected from a group consisting: (i) <10; (ii) 10-20; (iii) 20-30; (iv) 30-40; (v) 40-50; (vi) 50-60; (vii) 60-70; (viii) 70-80; (ix) 80-90; (x) 90-100.

7. A method as claimed in claim 6, wherein x≥80, 81, 82, 83, 84, 85, 86, 87, 88, 89 or 90.

8. A method as claimed in claim 1, wherein said reference value is a first average ion area, or first value correlated to an average ion area recorded at a first time T1.

9. A method as claimed in claim 8, wherein step (iii) further comprises:

(i) determining a second average ion area or a second value correlated to an average ion area at a later second time T2;

(ii) comparing said second average ion area or said second value correlated to an average ion area with said first average ion area or said first value correlated to an average ion area and determining whether or not said second average ion area or said second value correlated to an average ion area is within a first range;

wherein if it is determined that said second average ion area or said second value correlated to an average ion area falls outside of said first range then said method further comprises altering, adjusting or optimising a gain of said ion detector, electron multiplier or photomultiplier; and wherein if it is determined that said second average ion area or said second value correlated to an average ion area falls inside said first range then said method further comprises acquiring further data.

10. A method as claimed in claim 1, further comprising after a predetermined period of time or number of iterations of step (iii), repeating steps (i) to (iii).

11. A method as claimed in claim 10, further comprising operating said ion detector system under different operating conditions after said predetermined period of time or number of iterations of step (iii).

12. A method of mass spectrometry comprising a method as claimed in claim 1.

13. A control system for operating an ion detector system comprising an ion detector, electron multiplier or photomultiplier, wherein said control system is arranged and adapted:

(i) to determine a gain of the ion detector, electron multiplier or photomultiplier such that a desired signal to noise ratio (S/N) is achieved for the ion detector, electron multiplier or photomultiplier;

(ii) to determine an average ion area, or a value correlated to an average ion area when said ion detector, electron multiplier or photomultiplier is set at the gain determined in (i), and record this average ion area, or value correlated to an average ion area as a reference value; and (iii) to periodically or repeatedly alter, adjust or set the gain of the ion detector, electron multiplier or photomultiplier so as to maintain the average ion area, or value correlated to an average ion area at said reference value.

14. A mass spectrometer or analytical instrument comprising a control system as claimed in claim 13.

* * * * *